United States Patent
Colgan et al.

(10) Patent No.: US 12,235,045 B2
(45) Date of Patent: Feb. 25, 2025

(54) MAGNETIC ANNEALING EQUIPMENT AND METHOD

(71) Applicant: Tokyo Electron Limited, Tokyo (JP)

(72) Inventors: Ian Colgan, Meath (IE); Ioan Domsa, Dublin (IE); George Eyres, Dublin (IE); Bartlomiej Burkowicz, Dublin (IE); Barry Clarke, Dublin (IE); David Hurley, Dublin (IE); Einstein Noel Abarra, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 478 days.

(21) Appl. No.: 17/656,588

(22) Filed: Mar. 25, 2022

(65) Prior Publication Data
US 2023/0304741 A1 Sep. 28, 2023

(51) Int. Cl.
| | | |
|---|---|---|
| *H01L 21/00* | (2006.01) |
| *F27B 17/00* | (2006.01) |
| *F27D 3/00* | (2006.01) |
| *H01L 21/324* | (2006.01) |
| *F27D 7/06* | (2006.01) |

(52) U.S. Cl.
CPC ........ *F27B 17/0025* (2013.01); *F27D 3/0084* (2013.01); *H01L 21/324* (2013.01); *F27D 2007/066* (2013.01)

(58) Field of Classification Search
CPC ... F27B 17/0025; F27D 3/0084; H01L 21/324
See application file for complete search history.

(56) References Cited

U.S. PATENT DOCUMENTS

| | | | |
|---|---|---|---|
| 7,378,618 B1 | 5/2008 | Sorabji et al. | |
| 7,763,311 B2 * | 7/2010 | Suzuki | C23C 16/4405 700/95 |
| 7,867,560 B2 * | 1/2011 | Suzuki | C23C 16/45561 427/255.391 |

(Continued)

FOREIGN PATENT DOCUMENTS

| | | | | |
|---|---|---|---|---|
| CN | 105448654 A | * | 3/2016 | |
| TW | 202418400 A | * | 5/2024 | ........ F27B 17/0025 |

(Continued)

OTHER PUBLICATIONS

PCT International Search Report and Written Opinion, Application No. PCT/US2023/015980, Jul. 12, 2023, 13 pages.

(Continued)

*Primary Examiner* — Laura M Menz
(74) *Attorney, Agent, or Firm* — Slater Matsil, LLP

(57) ABSTRACT

The disclosure describes equipment for magnetic annealing of a substrate, the equipment including: an anneal chamber configured to heat and cool a substrate held at a soak location along a first direction in the anneal chamber, the anneal chamber including: a heater, a cooler, and a substrate lifter including a substrate holder, where the substrate holder is configured to support a substrate oriented such that the first direction is perpendicular to a major surface of the substrate; and a magnet assembly configured to establish a homogeneous zone in the anneal chamber, the soak location being within the homogeneous zone, the homogeneous zone including a region of magnetic field.

20 Claims, 11 Drawing Sheets

(56) References Cited

U.S. PATENT DOCUMENTS

| | | | |
|---|---|---|---|
| 7,986,871 B2* | 7/2011 | Ramamurthy | H01L 21/67103 392/407 |
| 8,536,492 B2* | 9/2013 | Ramamurthy | H01L 21/67103 219/390 |
| 8,837,924 B2* | 9/2014 | Tsunekawa | H01L 21/6719 118/724 |
| 9,410,742 B2* | 8/2016 | Colgan | F27B 17/0025 |
| 9,713,203 B2 | 7/2017 | Mani | |
| 10,003,018 B1* | 6/2018 | Colgan | C21D 9/0018 |
| 10,425,990 B2* | 9/2019 | Yasukawa | C23C 14/541 |
| 2006/0018639 A1* | 1/2006 | Ramamurthy | H01L 21/67103 392/416 |
| 2006/0110918 A1* | 5/2006 | Suzuki | H01L 21/76846 257/E21.17 |
| 2007/0231489 A1* | 10/2007 | Suzuki | C23C 16/16 427/255.28 |
| 2007/0232040 A1* | 10/2007 | Suzuki | H01L 21/76843 438/584 |
| 2007/0234955 A1* | 10/2007 | Suzuki | C23C 16/45565 438/586 |
| 2007/0234962 A1* | 10/2007 | Suzuki | C23C 16/45565 118/726 |
| 2008/0241357 A1* | 10/2008 | Suzuki | C23C 16/0209 700/95 |
| 2008/0241379 A1* | 10/2008 | Suzuki | C23C 16/4481 118/733 |
| 2008/0241380 A1* | 10/2008 | Suzuki | C23C 16/45561 427/255.28 |
| 2008/0241381 A1* | 10/2008 | Suzuki | C23C 16/4481 427/255.28 |
| 2009/0010626 A1* | 1/2009 | Ramamurthy | H01L 21/67103 392/416 |
| 2010/0151695 A1* | 6/2010 | Masaki | F27B 17/0025 219/385 |
| 2012/0193071 A1* | 8/2012 | Tsunekawa | H01L 21/67115 392/416 |
| 2012/0270166 A1 | 10/2012 | Sorabji et al. | |
| 2014/0003800 A1* | 1/2014 | Ramamurthy | H01L 21/67115 392/416 |
| 2016/0069613 A1* | 3/2016 | Colgan | H01L 21/67303 438/795 |
| 2016/0177412 A1* | 6/2016 | Ishii | C21D 1/26 266/110 |
| 2019/0371506 A1 | 12/2019 | Colgan et al. | |
| 2020/0123649 A1* | 4/2020 | Ono | C23C 14/5853 |
| 2020/0161095 A1* | 5/2020 | Swaminathan | C23C 14/505 |
| 2020/0232090 A1 | 7/2020 | Maehara et al. | |
| 2023/0304741 A1* | 9/2023 | Colgan | H01L 21/324 |

FOREIGN PATENT DOCUMENTS

| | | | | |
|---|---|---|---|---|
| WO | WO-2010150590 A1 | * | 12/2010 | H01L 21/67109 |
| WO | WO-2011043490 A1 | * | 4/2011 | C23C 14/541 |
| WO | WO-2018208603 A1 | * | 11/2018 | C21D 1/42 |
| WO | WO-2023183436 A1 | * | 9/2023 | F27B 17/0025 |

OTHER PUBLICATIONS

Brooks, David, "Basics of Ceramic Heaters," MachineDesign, https://www.machinedesign.com/materials/article/21832952/basics-of-ceramic-heaters, Aug. 28, 2013, 4 pages.

* cited by examiner

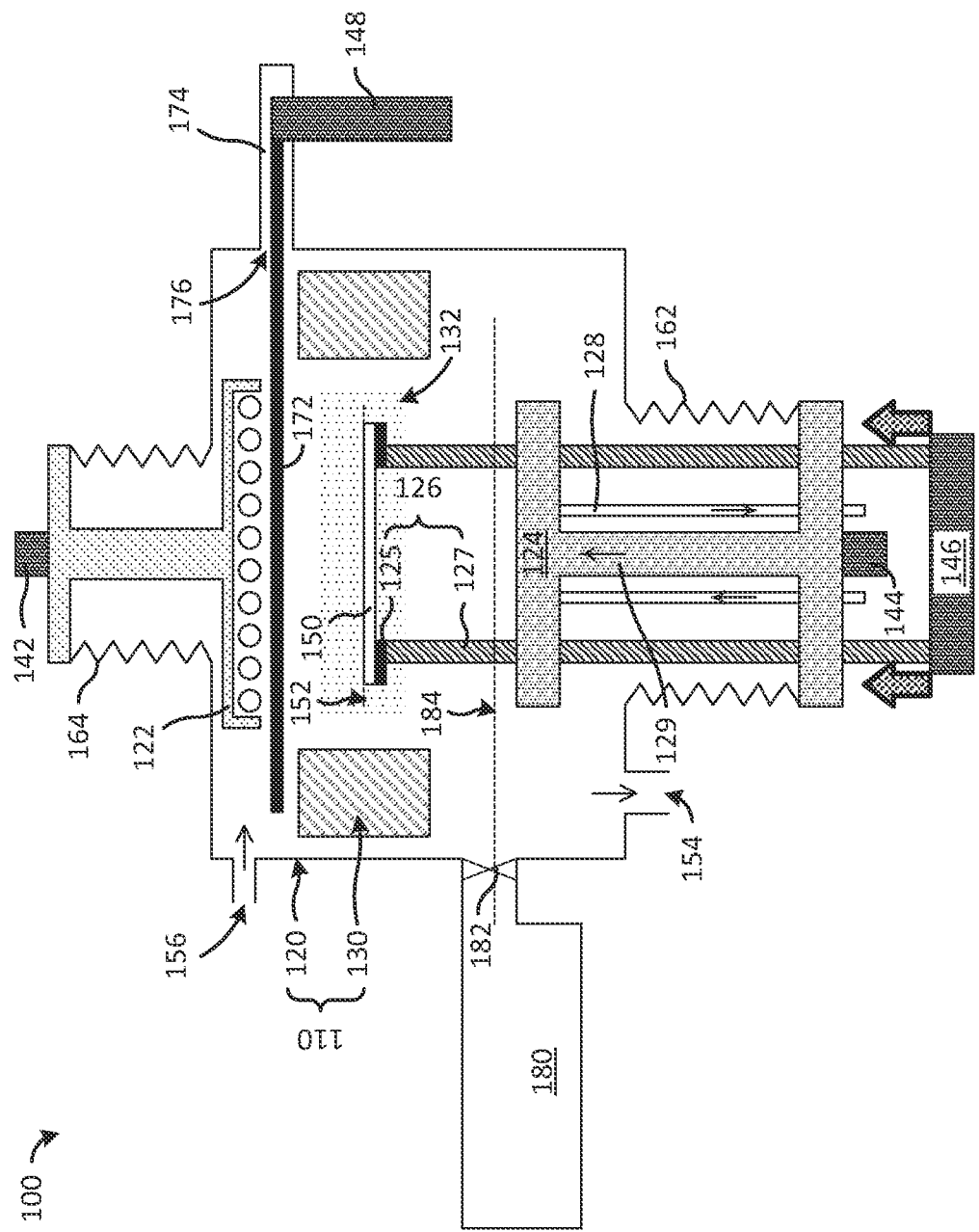

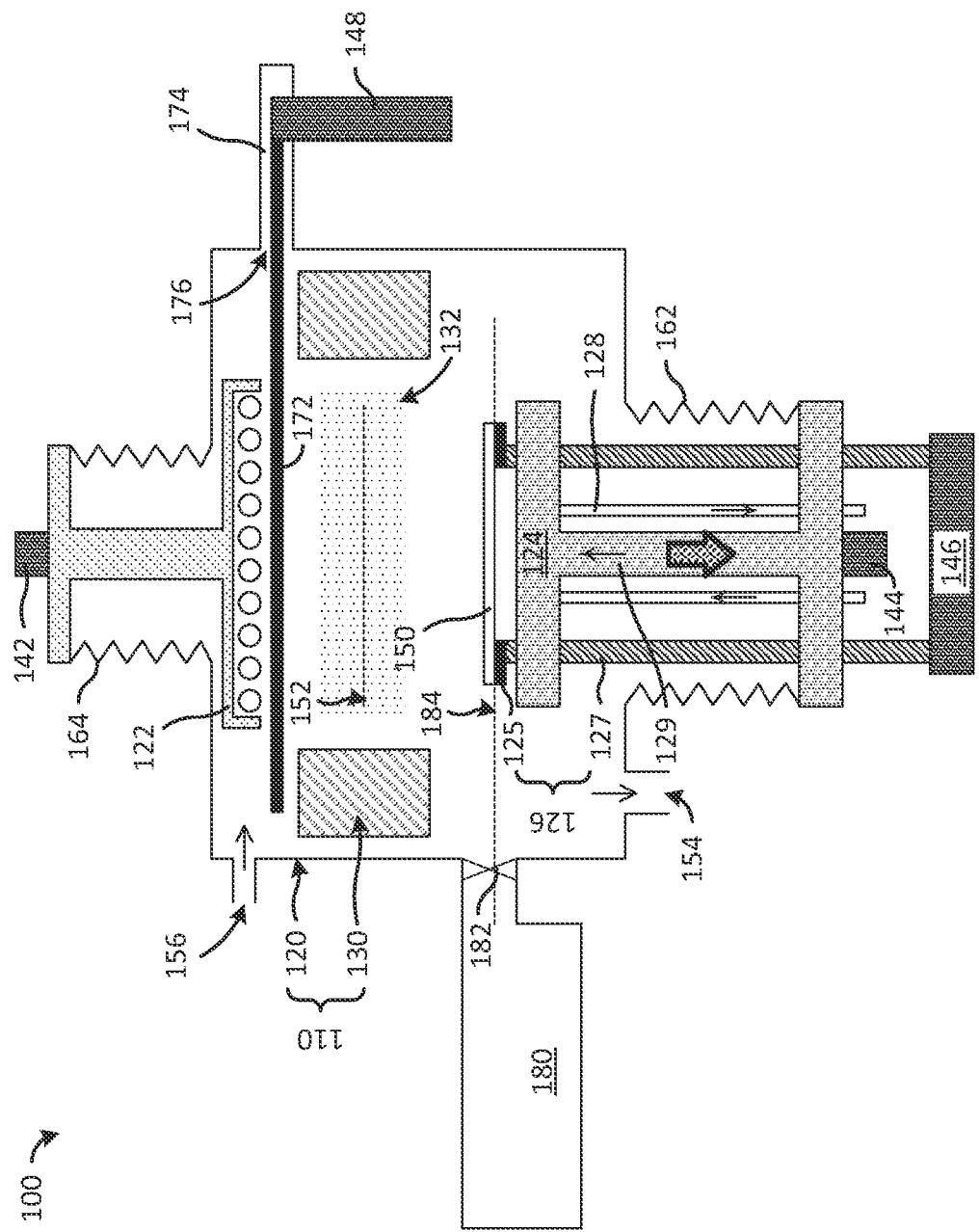

MAGNETIC ANNEALING EQUIPMENT AND METHOD

TECHNICAL FIELD

The present invention relates generally to equipment and method for processing a semiconductor substrate, and, in particular embodiments, to equipment and method for magnetic annealing of a semiconductor substrate.

BACKGROUND

Continual improvement in functionality and speed of integrated circuits (ICs) at the same cost has fueled the growth of semiconductors. The improvement is mainly due to increased packing density of components and wiring in functional building blocks of an IC (e.g., memory arrays, digital standard-cell library, and analog circuit blocks). Higher density is achieved by two means: reductions in feature size and increased vertical integration. The former increases pattern density at each patterning level, whereas the latter enhances packing density per unit area of the IC's footprint by placing components vertically, above the semiconductor substrate. Advances in process integration have enabled vertical placement of various devices including, for example, ferroelectric and magnetoresistive random access memory (FRAM and MRAM) cell arrays.

MRAM, where a nanoscale magnetic tunnel junction (MTJ) is the storage element, is emerging as a competitive non-volatile memory technology. Digital data is stored in an MRAM cell by programming its MTJ into one of two resistive states. For example, a "0/1" may be stored as a high/low resistance state of the MTJ. Each MTJ element has a pair of magnetized layers, a "free" layer and a "pinned" layer, separated by a thin dielectric layer. A write operation may switch the resistive state of the MTJ by flipping the magnetic polarity of the free layer while the magnetic polarity of the pinned layer is fixed by an antiferromagnetic pinning layer. Generally, a magnetic annealing process during fabrication initializes the magnetization direction of the magnetic films. Improvements in the throughput and manufacturing yield of MRAM-specific processes are needed as the production volume of ICs with MRAM starts to ramp up.

SUMMARY

Equipment for magnetic annealing of a substrate, the equipment including: an anneal chamber configured to heat and cool a substrate held at a soak location along a first direction in the anneal chamber, the anneal chamber including: a heater, a cooler, and a substrate lifter including a substrate holder, where the substrate holder is configured to support a substrate oriented such that the first direction is perpendicular to a major surface of the substrate; and a magnet assembly configured to establish a homogeneous zone in the anneal chamber, the soak location being within the homogeneous zone, the homogeneous zone including a region of magnetic field.

A method including: operating an anneal chamber in a substrate transfer mode to load the substrate from a transfer window location to a soak location in the anneal chamber, the anneal chamber includes a heater, a cooler, a substrate lifter including a substrate holder, and a homogeneous zone established in the anneal chamber by a magnet assembly, the homogeneous zone including a region of magnetic field, the soak location being within the homogeneous zone; operating the anneal chamber in a heating mode to heat the substrate at the soak location; operating the anneal chamber in a cooling mode to cool the substrate at the soak location; and operating the anneal chamber in the substrate transfer mode to unload the substrate from the anneal chamber via the transfer window location.

A system for processing a substrate, the system including: an anneal chamber configured to operate in a substrate transfer mode, heating mode, and a cooling mode, the anneal chamber including a heater, a cooler, and a substrate lifter; a magnet assembly establishing a homogeneous zone in the anneal chamber, the homogeneous zone being a region of magnetic field; a vertical drive system coupled to the anneal chamber and configured to move the heater, the cooler, and the substrate lifter between the substrate transfer, heating, and cooling modes; a load lock chamber and a gate valve coupling the load lock chamber to the anneal chamber, the load lock chamber including a robotic arm configured to transfer the substrate between the load lock chamber and the substrate lifter through the gate valve; and a controller programmed to synchronize the operation of the vertical drive system, and the load lock chamber.

BRIEF DESCRIPTION OF THE DRAWINGS

For a more complete understanding of the present invention, and the advantages thereof, reference is now made to the following descriptions taken in conjunction with the accompanying drawings, in which:

FIGS. 4A-4H illustrate various cross-sectional views of the system illustrated in FIG. 1 being operated at different stages of operation of the method summarized by the flow diagram illustrated in FIG. 3.

DETAILED DESCRIPTION OF ILLUSTRATIVE EMBODIMENTS

Figure 1:
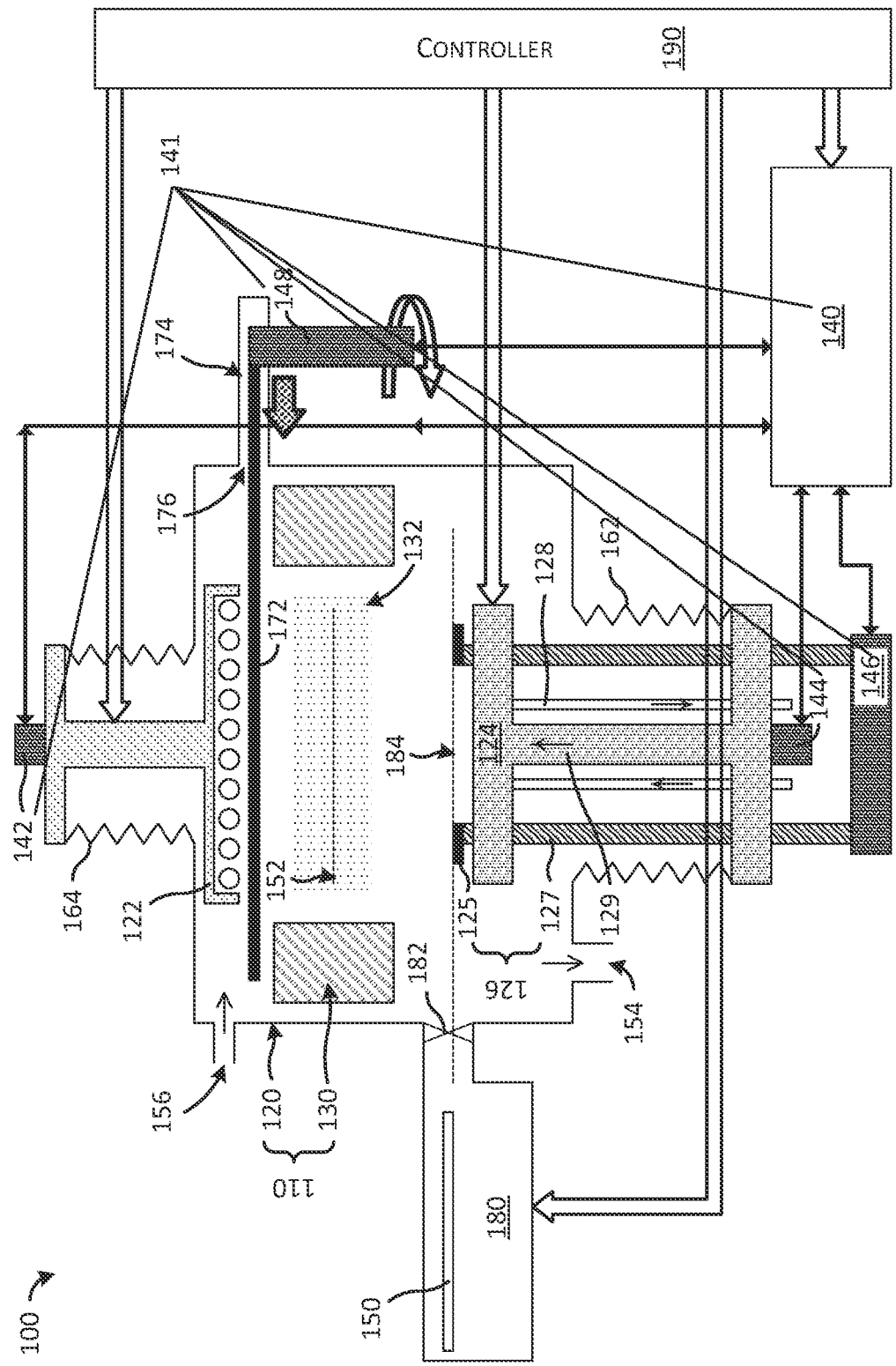
FIG. 1 illustrates a cross-sectional view of a system for processing a substrate through a magnetic annealing process step using a ceramic heater as a heat source, in accordance with an embodiment.

The disclosure describes embodiments of equipment and methods for magnetic annealing. In general, magnetic annealing is annealing a substrate, for example, a semiconductor wafer comprising magnetic materials in the presence of an external aligning magnetic field generated by magnets in a magnetic assembly of the magnetic annealing equipment. In the example magnetic annealing processes described in this disclosure, the substrate is held within a region inside an anneal chamber while the heating and cooling operations are being performed. The region where the substrate is held is referred to as the homogeneous zone. In the homogeneous zone, a unidirectional, uniform magnetic field has been established. In the embodiments discussed in this disclosure, the homogeneous zone is roughly a disk-shaped region of the anneal chamber, where a major surface of the substrate is oriented parallel to a central plane of the disk. The substrate is actively heated and cooled in a single-substrate processing anneal chamber configured to position and support the substrate within the homogeneous zone, at a location referred to as the soak location. The soak location is roughly in the central plane of the disk-shaped homogeneous zone. In some embodiments, the homogeneous zone is fixed and the substrate, positioned at the soak location, is held stationary there during both heating and cooling. In these embodiments, a heater and a cooler inside the anneal chamber may be moved as needed. In some other embodiments, the heater and the cooler are fixed but, the substrate and the homogeneous zone may be moved synchronously such that the soak location (the location where the substrate is held during active heating and cooling) is always in the central plane of the homogeneous zone. In these embodiments, the substrate may be maintained at the same soak location in the homogeneous zone a magnet assembly comprising movable magnets and actuators that are controlled synchronously to position the magnets and the substrate in a coupled fashion.

The embodiments and their advantages are described in the context of manufacturing ICs with an array of MRAM cells storing binary data as a high/low resistive state of an MTJ element. However, it is understood that the various aspects described in this application may be utilized for some other product where magnetic annealing is applied in processing a substrate.

The MTJ element comprises a dielectric layer (typically a metal oxide dielectric, e.g., magnesium oxide, titanium oxide, and aluminum oxide) with a thickness ranging typically from a nanometer to about 15 nm sandwiched between two magnetized ferromagnetic metal layers (or electrodes). The dielectric layer, referred to as the tunnel barrier layer, poses an energy barrier that obstructs conduction of electrons from the cathode to the anode when the MTJ is biased with a low voltage. However, because of the wave nature of electrons, there is a non-zero probability for electrons to tunnel through the tunnel barrier layer. The tunneling probability increases exponentially with decreasing dielectric thickness and, at the thicknesses of a barrier layer in an MTJ, the tunneling probability is high enough to sense a current in response to an applied voltage across the MTJ during a read operation.

The magnitude of the tunneling current in response to a bias voltage (or the conductance of the MTJ) depends on the magnetization direction in one ferromagnetic layer, referred to as the "free" layer, relative to that in the other ferromagnetic layer, which is the reference layer. In an MTJ element, the reference magnetic polarity is pinned; hence, the reference layer is often referred to as the "pinned" layer. As explained further below, the magnetic polarity in the pinned layer has been fixed by an adjacent antiferromagnetic pinning layer during the fabrication using a magnetic annealing process. Both free and pinned layers are fabricated with their respective magnetic polarity aligned along an in-plane direction (in a plane parallel to the metal-dielectric interface). During a write operation, the free layer may be programmed to align its magnetic polarity in the same direction (parallel mode) or opposite direction (antiparallel mode) as that of the reference pinned layer. The resistance of the MTJ in the parallel mode ($R_P$) is much lower than the resistance in the antiparallel mode ($R_{AP}$), a phenomenon known as the magnetoresistance effect that is used to store binary data "0/1" as the high/low resistance state of the MTJ. A large difference between $R_{AP}$ and $R_P$ provides robust sensing and noise immunity. Accordingly, a figure-of-merit for an MTJ is its tunneling magnetoresistance ratio, TMR, defined by TMR=$(R_{AP}-R_P)/R_P$.

The high and low resistive states of the MTJ are explained from the understanding that, in addition to conserving energy and momentum, electron tunneling conserves electron spin. This implies that the tunneling current depends not only on the tunneling probability but also on the number of pairs of occupied and empty electronic states on either side of the insulator, where both of the electronic states have the same electron energy, momentum, and spin. Consider an extreme case where both ferromagnetic layers are one hundred percent polarized during the write operation. In such an MTJ, in the antiparallel mode, there are zero empty states in the anode having the same spin as any of the occupied electronic states in the cathode; hence, the tunneling current is zero and TMR approaches infinity. In the other extreme, it may be very difficult to spin-polarize the electrodes. Then, there is negligible difference detected between the parallel mode and the antiparallel mode; hence, ($R_{AP} \approx R_P$) and TMR is almost zero. The TMR of various MTJ storage elements are typically between about four and 100.

The significance of achieving a high degree of polarization for robust data storage and retrieval may be better appreciated in terms of a spin polarization factor, P, for an electrode representing the fraction of the electrons at the Fermi energy that are spin polarized in the same direction. For each electrode, P is given by $P=(N_\uparrow-N_\downarrow)/(N_\uparrow+N_\downarrow)$, where $N_\uparrow$ and $N_\downarrow$ denote the density of electronic states at the Fermi energy with spin up and spin down, respectively. It is noted that P is equal to +1 or −1 for perfect polarization, i.e., $N_\downarrow=0$ or $N_\uparrow=0$, respectively, and P=0 for an unpolarized electrode, where $N_\downarrow=N_\uparrow$. The polarization factors of the free layer, $P_{free}$, and the pinned layer, $P_{ref}$, are related to the TMR of the MTJ, with TMR=$2(P_{free}P_{ref})/(1-P_{free}P_{ref})$. For perfect polarization, $P_{free}=P_{ref}=+1, -1$ and TMR approaches infinity, while, for unpolarized electrodes, $P(P_{free}=P_{ref}=0)$ and TMR is zero. The TMR may be sensitive to P, particularly so for a high degree of polarization. The relation between the polarization factors and TMR emphasizes that, during fabrication, the process steps that affect spin polarization of the ferromagnetic layers, such as magnetic annealing, should be optimized for uniformity and repeatability.

The antiferromagnetic pinning layer, used to fix the magnetic polarity in the ferromagnetic reference layer, may comprise, for example, chromium, binary alloys of manganese with platinum, iridium, and iron, and oxides of transition metals such as iron, cobalt, nickel, manganese, and chromium. The ferromagnetic layers may comprise nickel, iron, cobalt, and their alloys. Ferromagnetic and antiferromagnetic materials may exhibit long-range ordering of a magnetic moment of constituent atoms in the absence of an external magnetic field, unless heated above a transition temperature, referred to as the Curie temperature for ferromagnetic and the Néel temperature for antiferromagnetic materials. The magnetic moments of adjacent atoms align in a parallel direction in a ferromagnetic material but are antiparallel in an antiferromagnetic material. In these materials, the atomic magnetic moment results primarily from the spins of unpaired electrons. Generally, an MTJ stack comprises the tunnel barrier layer, the free and pinned layers on opposite sides of the tunnel barrier layer, and the pinning layer, adjacent to the pinned layer.

An antiferromagnet may pin the magnetic moments of a ferromagnet through a mechanism known as exchange bias. Exchange bias occurs in a ferromagnetic-antiferromagnetic bilayer, where an exchange interaction between the interfacial atoms couples the ferromagnet to the antiferromagnet. A strong coupling would pin the magnetic moment of the ferromagnetic atoms near the interface, i.e., an extra energy, equivalent of the energy for building a domain wall in the antiferromagnet near the interface, would be needed to reverse the magnetic moment in the coupled ferromagnet.

The pinning of the exchange-biased ferromagnetic layer is manifested as a shift in its magnetization curve (the "B-H" curve). The magnetization, B, of the bilayer being shifted along the H-axis (where H is the external magnetizing field), a stronger H would be required to flip B from its direction at H=0.

The direction of the exchange bias or, equivalently, the magnetic polarity of the pinned layer is set with a magnetic annealing process. The magnetic materials for the ferromagnetic-antiferromagnetic bilayer of the MTJ stack may be selected such that the Curie temperature of the ferromagnetic layer is higher than the Néel temperature of the antiferromagnetic pinning layer. The magnetic polarity of the ferromagnetic layer of such a bilayer would then be pinned in the direction of the external aligning magnetic field of the magnetic annealing process, provided the annealing heats the substrate to a temperature above the Curie temperature and, then, cools the substrate through the Néel temperature. The desired direction is selected by orienting the substrate appropriately relative to the aligning magnetic field prior to annealing.

An example system 100 for processing a substrate through a magnetic annealing process is described with reference to a cross-sectional view, illustrated schematically in FIG. 1. The system 100 includes an example equipment no for magnetic annealing comprising an anneal chamber 120 and a magnet assembly 130. The example magnet assembly 130 is described with reference to a planar view illustrated in FIG. 2. The example anneal chamber 120 comprises a heater 122, a cooler 124, and a substrate lifter 126. FIG. 3 illustrates a system 300, where the example heater 122 in the system 100 (illustrated in FIG. 1) has been replaced by a different heater design. A method 400 for processing the substrate through a magnetic annealing process step is summarized with reference to a flow chart illustrated in FIG. 3. The method 400 may be executed using the system 100 illustrated in FIG. 1. An example of magnetic annealing, performed using the method 400 executed with the system 100, is illustrated with reference to various cross-sectional views of the system 100, illustrated in FIGS. 4A-4H.

FIG. 1 illustrates the example system 100 comprising the equipment no, where the anneal chamber 120 of the equipment no is configured in an initial configuration and, the magnet assembly 130 of the equipment no has established a region of a unidirectional uniform magnetic field, referred to as the homogeneous zone 132. The heater 122, cooler 124, and substrate lifter 126 may be independently moved in a first (vertical) direction by linear actuators 142, 144, and 146, respectively. The substrate lifter 126 comprises movable lift rods 127 that are connected to a substrate holder 125. The substrate holder 125 of the substrate lifter 126 is configured to support the substrate 150 in an orientation where a major surface of the substrate 150 is perpendicular to the first direction, i.e., the surface is horizontal. During heating and cooling, the substrate 150 would be held inside the anneal chamber 120 at a soak location 152 within the homogeneous zone 132, indicated by a dashed line in FIG. 1. In this example embodiment, the magnet assembly 130 is a permanent magnet that is shaped like an annular cylinder going around the sidewall inside the anneal chamber 120. The homogeneous zone 132 is within the central bore of the cylindrical magnet, with the magnetic field directed in a horizontal plane, parallel to the major surface of the substrate 150. As explained further below with reference to FIG. 2, a Halbach cylinder formed by a circular array of magnets may be configured to establish a unidirectional uniform magnetic field in the cylinder along the planes perpendicular to a central axis of the cylinder. Although, in the example system 100, the magnet assembly 130 is a permanent magnet disposed inside the anneal chamber 120, in general, a magnetic system may comprise electromagnets and permanents magnets which may be located inside and outside the anneal chamber 120.

The magnetic annealing equipment no, illustrated in FIG. 1, is an example where the magnet assembly 130 is stationary and the soak location 152 is a fixed location in the anneal chamber 120. However, the heater 122 the cooler 124 may be moved, as needed. As mentioned above, in some other embodiment, the heater and the cooler are stationary but, the magnets establishing the homogeneous zone are movable to move the soak location in the homogeneous zone relative to the heater and the cooler, as needed for heating and cooling. In these embodiments, a substrate may be maintained at the soak location by using actuators that are controlled synchronously to position the magnets and the substrate in a coupled fashion.

In the initial configuration of the anneal chamber 120 illustrated in FIG. 1, the substrate-lifter 126 is positioned at a transfer window location 184, indicated by another dashed line below the soak location 152. The cooler 124 is positioned at a cooler parking location below the transfer window location 184 and, the heater 122 is positioned at a heater standby location on the opposite side of the soak location 152. In FIG. 1, the substrate holder 125 is positioned to receive the substrate 150 at the substrate transfer location 184 between the soak location 152 and the cooler parking location. Thus, in this example embodiment, the substrate 150 is held between the cooler 124 and the heater 122 during the time the substrate 150 is located within the anneal chamber 120. In other words, if a front side of the substrate 150 faces the heater 122 then a backside of the substrate 150 faces the cooler 122. However, it is understood that the inventive aspects of this embodiment may be adapted to a processing system where the apparatus is configured such that the same side of the substrate faces the heater and the cooler.

The example heater 122, shown schematically in FIG. 1, is a ceramic heater using a conductive heating element. Other resistive heaters as well as other heating mechanisms such as inductive heating, microwave radiation, and a plasma torch could also be used. The plasma torch may heat the substrate using energetic, charge neutral, and chemically inert particles from a remote plasma source.

In general, ceramic heaters are very reliable and rarely require maintenance, which is advantageous for placing the heater 122 inside the anneal chamber 120. An advantage of having the heater 122 inside the anneal chamber 120 is that rapid and uniform heating may be achieved by positioning the heat source in close proximity of the substrate 150 during heating. Furthermore, the distance between the heater 122 and the soak location may be variable and the position of the heater 122 may be adjusted dynamically during heating to achieve a desired temperature profile. Additionally, a heater with a rotatable head may be used to rotate heat source of the heater 122 during heating to improve temperature uniformity across a substrate.

The example cooler 124 in FIG. 1 is a cooling chuck comprising, for example, stainless steel or aluminum. The cooling mechanism comprises both liquid and gas refrigerants for rapid cooling. As illustrated in FIG. 1, the cooler 124 is equipped with pipes 128 through which a liquid refrigerant such as water may be circulated. In addition, an inert gas (e.g., helium, nitrogen, and argon) may be forced through a central column 129 to assist cooling the substrate 150.

In addition to the anneal chamber 120 and the magnet assembly 130, the system 100 comprises a load lock chamber 180, a baffle chamber 174 comprising a heat baffle 172, a rotary actuator 148, linear actuators 142, 144, and 146, a driving mechanism 140 configured to execute instructions to operate the actuators, and a controller 190 configured to provide instructions to the load lock chamber 180, the driving mechanism 140, the heater 122, and the cooler 126 in order to synchronously operate the anneal chamber 120. The linear actuators 142, 144, and 146, the optional rotary actuator 148, and the driving mechanism 140 collectively form a drive system 141, as illustrated in FIG. 1.

It is understood that all the actuators 142, 144, and 146 need not be included simultaneously in one embodiment. For example, in some embodiments, the heater 122 may be stationary in the anneal chamber 120 while the cooler 124 is movable. In such an embodiment, the linear actuator 142 may be omitted. Also, as mentioned above, in some other embodiments, the magnets of the assembly is movable, while the heater and the cooler are stationary. In such embodiments, an anneal chamber having a different configuration of actuators would be used.

The anneal chamber 120 in FIG. 1 is coupled to a gas flow system via a gas inlet 156 and a gas outlet 154. In some embodiments, the anneal chamber 120 is a vacuum chamber and the gas outlet 154 may be connected to a vacuum pump. The magnetic annealing process is generally performed in a chemically inert gaseous ambient at a controlled low pressure.

The load lock chamber 180 is coupled to the anneal chamber by a transfer window controlled by a gate valve 182. A robotic arm (not shown) comprising a substrate paddle may insert and retract the substrate 150 through the transfer window and the gate valve 182.

The baffle chamber 174 is shaped like a partial disk that is large enough to accommodate a heat baffle 172. The rotary actuator 148 (e.g., an electric motor) may rotate the heat baffle 172 between the anneal chamber 120 and the baffle chamber 174 through a baffle window 176. The baffle window 176 is shaped like a slit in the sidewall of the anneal chamber 120. As illustrated in FIG. 1, the heat baffle 172 has been inserted in the anneal chamber 120 and positioned at a location between the heater standby location and the soak location 152 by the rotary actuator 148, as indicated by a clockwise circular arrow and a block arrow pointing to the left in FIG. 1. Thus positioned, the heat baffle 172, comprising, for example, aluminum or stainless steel may function as a heat absorber that shields the region below from the heater 122. The shielded region includes the homogeneous zone 132 and the soak location 152. In some embodiment, the heat baffle 172 may optionally include a cooling jacket cooled by a flow of refrigerant such as water.

Both the heater 122 and the cooler 124 may be moved close to the soak location 152 during heating and cooling, respectively. The motion is actuated by linear actuators 142 and 144 operated by the driving mechanism 140. The vertical movements of the heater 122 and the cooler 124 may be facilitated by having flexible bellows 162 and 164. Moving the heater 122 and the cooler 124 allows the substrate 150 to remain static at the soak location 152 in the homogeneous zone 132 during the magnetic annealing process. One advantage of maintaining a fixed position in the magnetic field is that this provides better control of the magnetic field magnitude, direction, and spatial uniformity.

As is shown schematically in FIG. 1, the driving mechanism 140 is coupled to the actuators (e.g., the rotary actuator 148 and the linear actuators 142, 144, and 146) and the controller 190. The equipment no is configured to operate in a substrate transfer mode, a heating mode, and a cooling mode. Depending on the operating mode of the equipment 110, instructions are sent by the controller 190 to the driving mechanism 140 to position the movable heater 122, substrate-lifter 124, cooler 126, and the heat baffle 172. The method for operating the equipment no and the instructions provided to the driving mechanism 140 in the various operating modes are described in detail further below with reference to FIGS. 4A-4H.

Figure 2:
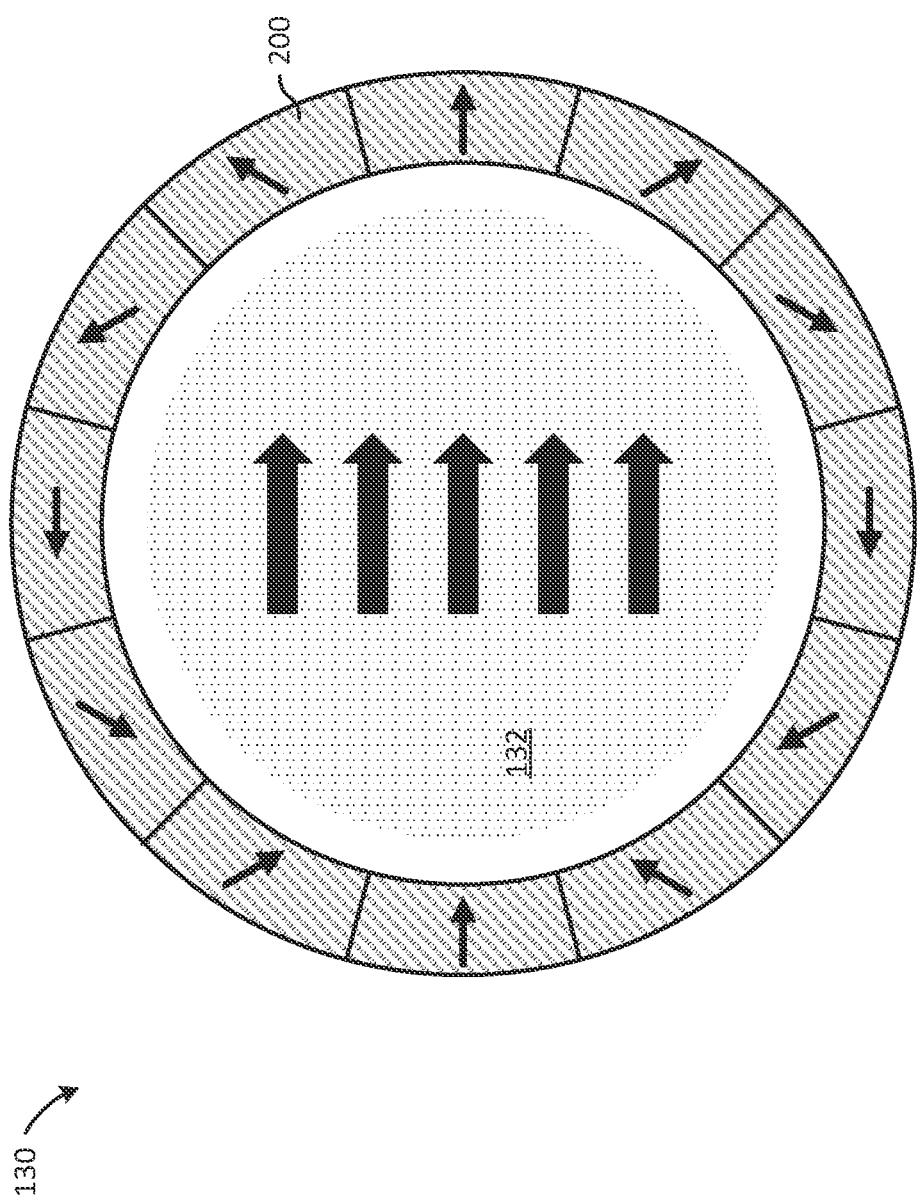
FIG. 2 illustrates a planar view of a magnet assembly for a system for processing a substrate through a magnetic annealing process step, in accordance with an embodiment.
Figure 3:
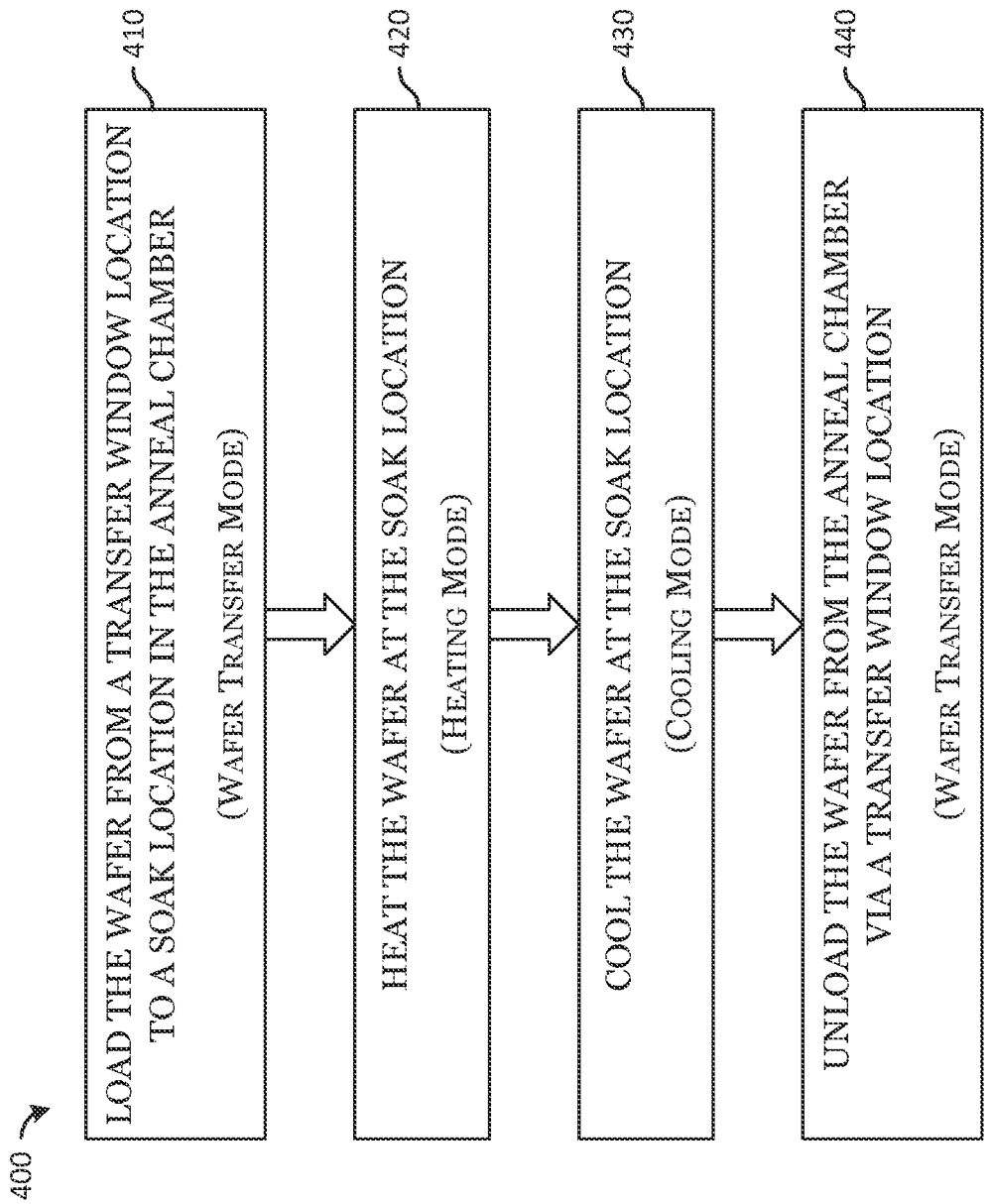
FIG. 3 illustrates a flow chart of a method for processing a substrate through a magnetic annealing process step, in accordance with an embodiment.

FIG. 2 illustrates a planar view of the magnet assembly 130 with the homogeneous zone 132. The various other components of the system 100, described above with reference to FIG. 1, are omitted for clarity. In this example embodiment, the magnet assembly 130 is a particular type of Halbach array, referred to as a Halbach cylinder. In general, a Halbach array comprises an arrangement of a plurality of magnetic segments, where the magnetization direction of successive magnetic segments of the array is spatially rotating in a manner that augments the magnetic field on one side of the array and diminishes the magnetic field on the opposite side of the array. The Halbach cylinder, such as the magnet assembly 130, illustrated in FIG. 2, is formed by a circular array of magnetic segments 200. The spatial rotation of the magnetization direction (indicated by an arrow in each segment 200) may be selected to be in an arrangement such that the arrangement of the magnetic segments 200 forms a magnetization pattern that establishes the homogeneous zone 132 within the central bore of the Halbach cylinder. The direction of the unidirectional magnetic field, as indicated by the block arrows in FIG. 2, is along the planes perpendicular to a central axis of the cylinder. Placing the magnet assembly 130 in the anneal chamber 120 provides the advantage of a more compact design of equipment no. It is understood that, in addition to a Halbach cylinder magnet (illustrated in FIG. 2), other types of magnets may also be incorporated.

FIG. 3 illustrates a flow diagram of a method 400 for performing magnetic annealing of a semiconductor substrate using the system 100 (described above with reference to FIG. 1). As illustrated in FIG. 3, executing the method 400 may be summarized as operating the magnetic annealing equipment no of system 100 sequentially through four broad steps: a loading step 410, a heating step 420, a cooling step 430, and an unloading step 440. The anneal chamber 120 of equipment no is configured to operate in a substrate transfer mode for the loading step 410 and the unloading step 440, in a heating mode for the heating step 420, and a cooling mode for the cooling step 430. The configurations and the sequential operations of the method 400 are described further below with reference to FIG. 3 and FIGS. 4A-4H.

For the sake of clarity, FIGS. 4A-4H have omitted the driving mechanism 140 and associated coupling with the actuators (e.g., the rotary actuator 148 and the linear actuators 142, 144, and 146). In addition, in FIGS. 4A-4H, the controller 190 and the associated coupling providing instructions to the load lock chamber 180, the driving mechanism 140, the heater 122, and the cooler 126 have been omitted for clarity.

Figure 4A:
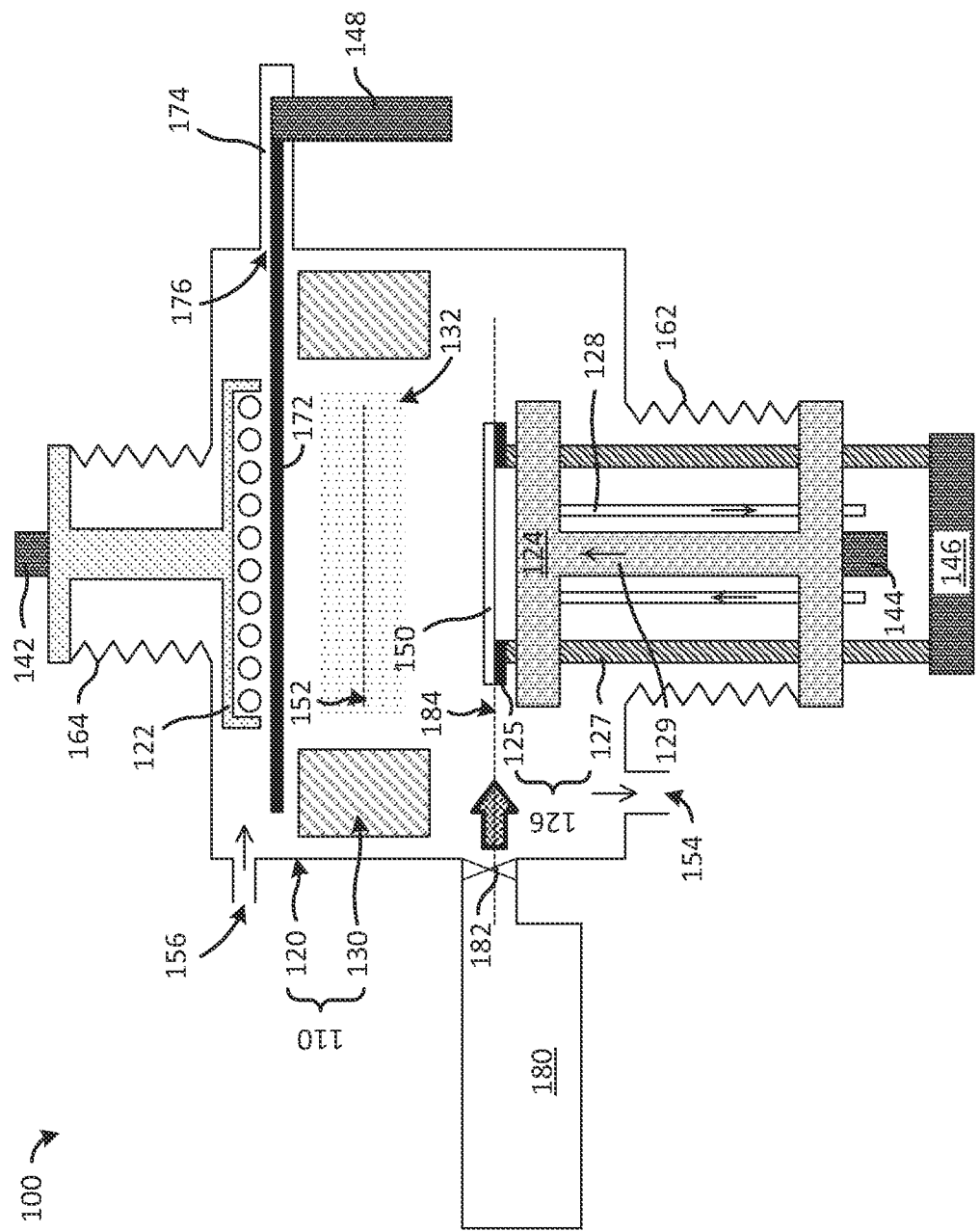

Referring to block 410 of the flow-diagram 400 in FIG. 3 and the cross-sectional views of the system 100 in FIG. 4A-4B, the anneal chamber 120 is being operated in the substrate transfer mode to load the substrate 150 in the anneal chamber 120.

In the substrate transfer mode, the heater 122 is at the heater standby location on the opposite side of the soak location as the cooler 124. The optional heat baffle 172 has been inserted in the anneal chamber 120 and positioned between the heater 122 and the soak location 152 (as described above with reference to FIG. 1). The heater standby location is generally selected to be located at a distance from the soak location 152 such that, at the heater standby location, the heater 122 would have negligible thermal coupling to a substrate at the soak location 152. In some embodiments, in order to reduce the ramp-up time during heating, the heater 122 in the heater standby location may be receiving a low level of power. One advantage of having the optional heat baffle 172 is that the heater 122 standby power level may be increased; thereby further reducing the time required to ramp up the temperature to the final soak temperature during heating. For example, in one embodiment, where the soak temperature is about 200° C. to about 700° C., the heater 122 may be maintained at about 100° C. to about 350° C. at the heater standby location by inserting a heat baffle 172 for thermal isolation. In some other embodiment, which does not have the optional heat baffle 172, the power provided to the heater 122 may be shut off while the heater 122 is at the heater standby location. The array of open circles in the schematic representation of the ceramic heater 122 represents the heating element in a low power state or off state.

Since the substrate transfer mode is for loading the substrate 150, initially, the cooler 124 is positioned at the cooler parking location (as described above with reference to FIG. 1) and the substrate holder 125 of the substrate lifter 126 is at the substrate transfer location 184 in the chamber 120. In FIG. 4A, instructions from the controller 190 (see FIG. 1) are executed by the load lock chamber 180 to open the gate valve 182 and extend the robotic arm (not shown) to move the substrate 150 through the transfer window from the load lock chamber 180 to the substrate transfer location 184. The movement of the substrate 150 into the anneal chamber 120 is indicated by a block arrow pointing to the right in FIG. 4A. At the transfer window location 184, with instructions from the controller 190, the driver mechanism 140 operates the linear actuator 146 to lift the substrate 150 off the substrate paddle of the robotic arm to transfer the substrate 150 to the substrate holder 125 of the substrate lifter 126. The robotic arm is then retracted from the anneal chamber 120 through the transfer window and the gate valve 182 is again closed.

In FIG. 4B, the controller has provided further instructions for the driving mechanism 140 to operate the linear actuator 146 to extend the lift rods 127 vertically up to move the substrate 150 (supported by the substrate holder 125) from the transfer window location 184 to the soak location 152 within the homogeneous zone 132. The upward movement of the substrate 150, supported by the substrate holder 125, is indicated by two block arrows pointing upward (next to the lift rods 127 near the linear actuator 146).

Figure 4C:
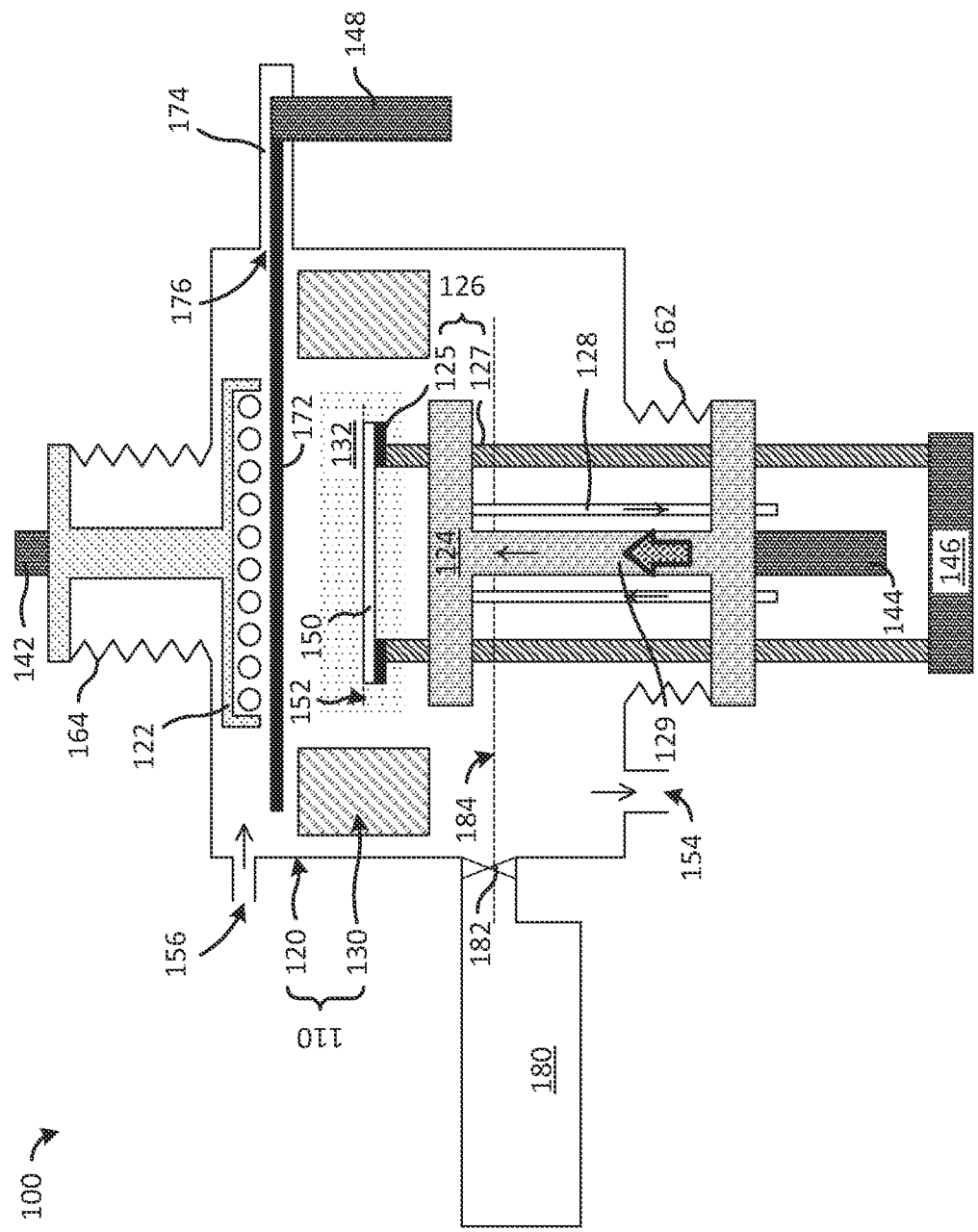

After the substrate holder 125 and the substrate 150 have been positioned at the soak location 152, the driving mechanism 140 is instructed to move the cooler 124 to the cooler standby location. As illustrated in FIG. 4C, the driving mechanism 140 then operates the linear actuator 144 to move the cooler 124 toward the substrate to the cooler standby location. The upward movement of the cooler 124 is indicated by a block arrow pointing upward. The cooler standby location is selected to be located at a sufficient distance from the soak location 152 to prevent the cooler 124 from cooling the substrate 150, when the cooler 124 is at the cooler standby location. An advantage of moving the cooler 124 closer to the substrate 150 (held by the substrate holder 125 at the soak location 152) is that the cooler 124 may be quickly moved to an active cooling location proximate the soak location 152 when the anneal chamber 120 is to be operated in the cooling mode. In some embodiment, where the cooler 124 comprises a major surface that reflects infrared radiation, for example, a top surface of a cooling chuck, there is a further advantage of selecting a less remote cooler standby location. During heating, the cooler may reduce radiation heat loss by reflecting the radiation back toward the substrate 150.

Figure 4D:
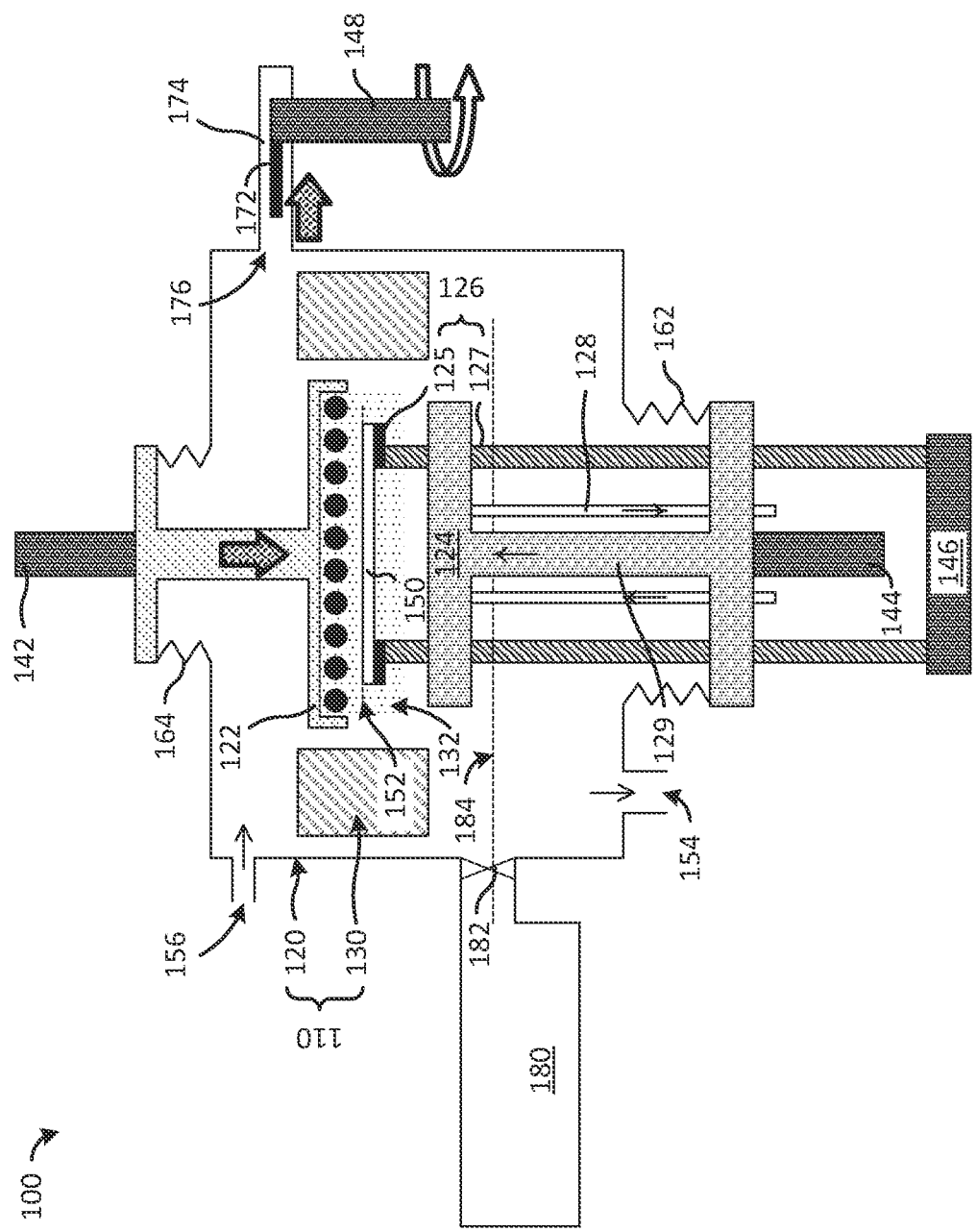
Figure 4E:
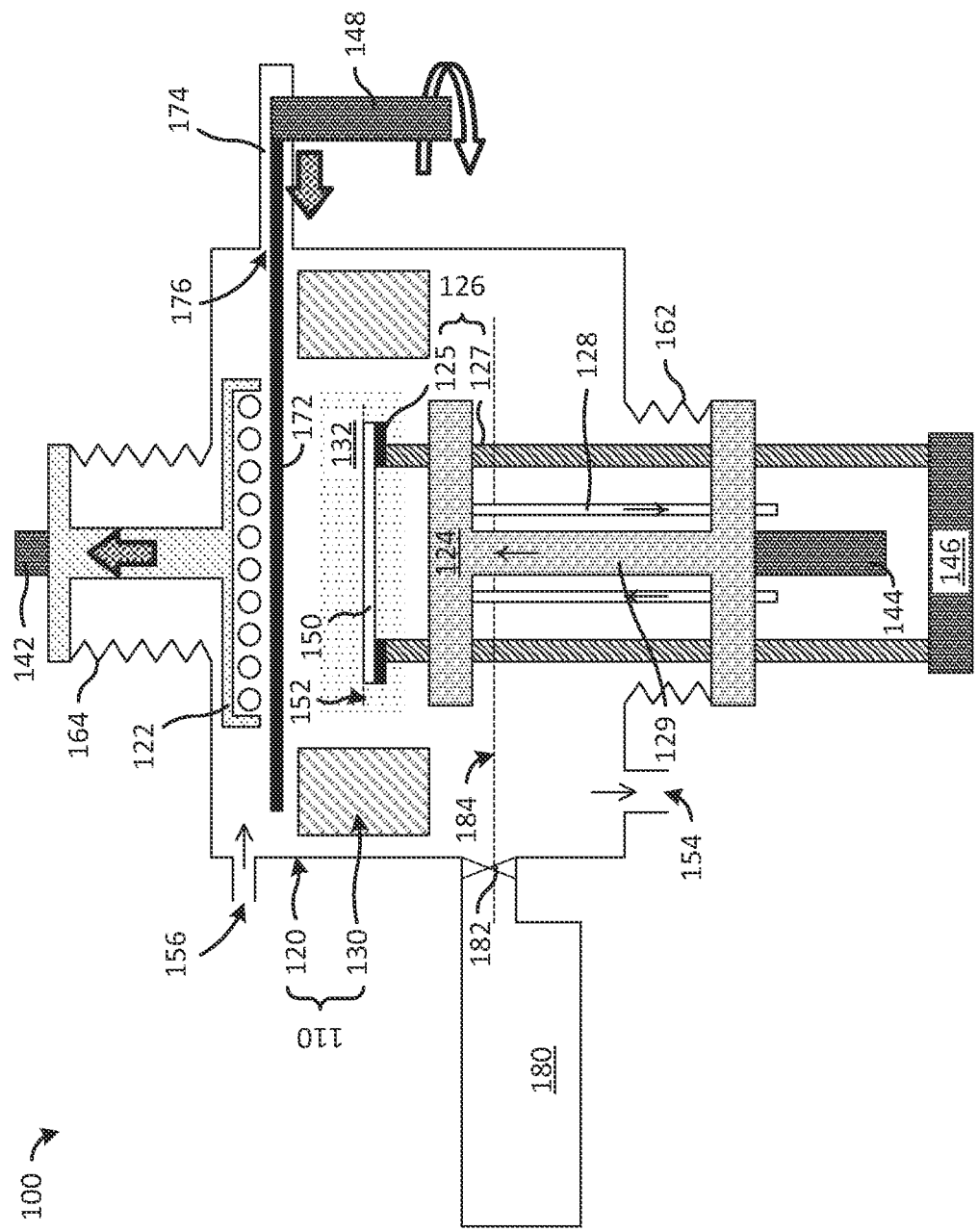

Operation of the anneal chamber 120 in the heating mode to heat the substrate 150 in presence of the magnetic field in the homogeneous zone 132 (block 420 of the flow-diagram 400 in FIG. 3) is illustrated by the cross-sectional views of the system 100 in FIGS. 4D-4E.

In FIG. 4D, the controller 190 has instructed the driving mechanism 140 to set up the anneal chamber 120 in a heating configuration for operating the anneal chamber 120 in the heating mode. Accordingly, the driving mechanism 140 has operated the rotary actuator 148 to rotate the optional heat baffle 172 away from the anneal chamber 120 into the baffle chamber 174. The rotational motion leading to retraction of the heat baffle 172 is indicated in FIG. 4D by a counterclockwise circular arrow and a block arrow pointing to the right near the baffle chamber 174. Once the heat baffle 172 has been retracted, the heater 122 may be moved from the heater standby location to an active heating location proximate the substrate iso, which is being supported by the substrate holder 125 at the soak location 152. The linear actuator 142 may be operated by the driving mechanism 140 to lower the heater 122 to the active heating location, as indicated by a block arrow pointing downward. With the heater 122 positioned above the front side of the substrate iso, the controller 190 instructs the heater 122 to power up from the low-power level in standby to an active power level to heat the substrate at a selected high soak temperature for a selected soak duration. The higher active power level is indicated schematically by the array of solid circles representing the heating element of the ceramic heater 122.

After the soak duration, the power provided to the heater 122 is reduced back to the standby power level, as illustrated in FIG. 4E by the array of open circles in heater 122. After the heating of the substrate 150 is complete, the heater 122 is returned to the heater standby location by operating the linear actuator 142. The upward motion of the heater 122 is indicated by a block arrow pointing upwards in FIG. 4E. In embodiments using the optional heat baffle 172, the driving mechanism 140 may now operate the rotary actuator 148 to re-insert the heat baffle 172 in the anneal chamber 120, as seen in the example embodiment illustrated in FIG. 4E. The rotational motion of the heat baffle 172 for re-insertion between the heater standby location and the soak location 152 is indicated by a clockwise circular arrow and a block arrow pointing to the left.

Figure 4F:
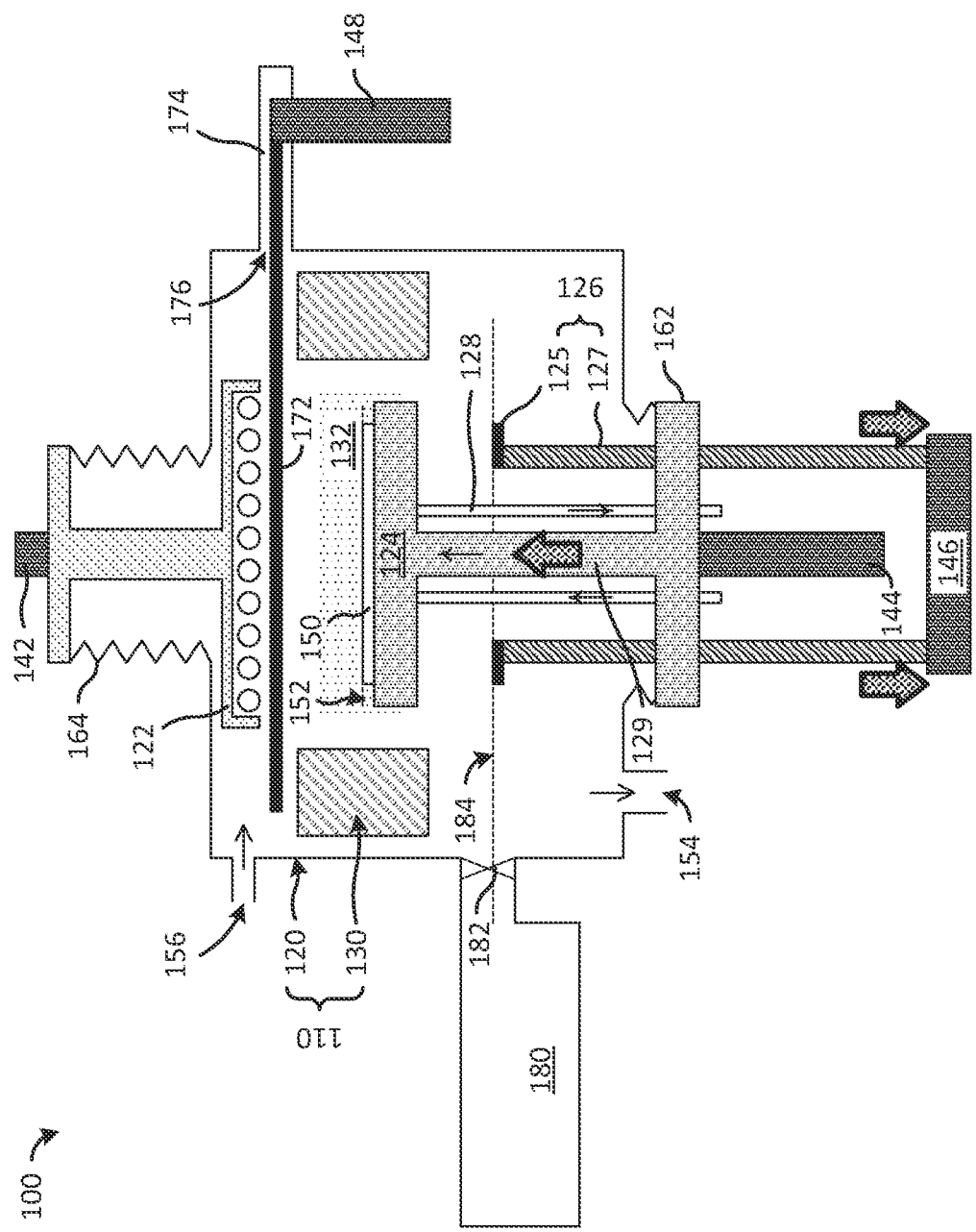

Operation of the anneal chamber 120 in the cooling mode to cool the substrate 150 presence of the magnetic field in the homogeneous zone 132 (block 430 of the flow-diagram 400 in FIG. 3) is illustrated by the cross-sectional views of the system 100 in FIGS. 4F-4G.

In FIG. 4F, the controller 190 has instructed the driver mechanism 140 to move the cooler 124 from the cooler standby location to an active cooling location proximate the substrate located at the soak location 152. Accordingly, the linear actuator 144 is operated to move the cooler to the active cooling location. In the example embodiment illustrated in FIG. 4F, the cooler 124 is a cooling chuck cooled by a circulating liquid refrigerant flowing through the pipes 128, as described above. A top surface of the cooler 124 is physically in contact with the backside of the substrate 150 for efficient heat removal to cool the substrate 150. In this example, the substrate holder 125 has released the substrate 150 by being moved away from the substrate 150. The cooler 124 is supporting the substrate 150 in the soak location 152 during cooling. The exact position of the substrate holder 125 is irrelevant, as long as the lift rods 127 of the substrate lifter 126 are moved by the linear actuator 146 to position the substrate holder 125 below the soak location 152 but not below the cooler parking location. In the example in FIG. 4F, the substrate holder 125 is positioned at the transfer window location 184. In FIG. 4F, the movement of the substrate lifter 126 is indicated by two block arrows pointing downward.

In some other embodiment, the top surface of the cooler 124 may be placed close to but not physically in contact with the backside of the substrate 150, and the substrate lifter 126 may be supporting the substrate 150 when the anneal chamber 120 is operated in the cooling mode. The gap between the substrate 150 and the top surface of the cooler 124 would allow an inert gas refrigerant to be forced through a central column 129 to assist cooling the substrate 150, as mentioned above with reference to FIG. 1.

Power required to circulate the liquid refrigerant and to force the cooling gas to flow is sustained until the substrate is cooled below a selected low temperature. Typically, the selected low temperature is greater than room temperature but less than the Curie temperature of the ferromagnetic material and the Néel temperature of the antiferromagnetic material, as explained above. Although greater than room temperature, the selected low temperature may not exceed 150° C. in an embodiment where the method 400 (see FIG. 3) is applied for magnetic annealing of MRAM cells. As mentioned above, the substrate 150 remains static in the magnetic field of the homogeneous zone 132 during heating and cooling.

After the substrate 150 is cooled below the selected low temperature, the cooler 124, supporting the substrate 150, may be lowered by operating the linear actuator 144. As the cooler 124 is lowered below the location of the substrate holder 125, the substrate 150 is again supported by the substrate holder 125, as illustrated in FIG. 4G. The cooler 124 is lowered further to the cooler parking location. The motion of the cooler 124 in FIG. 4G is indicated by a block arrow pointing downward.

Figure 4H:
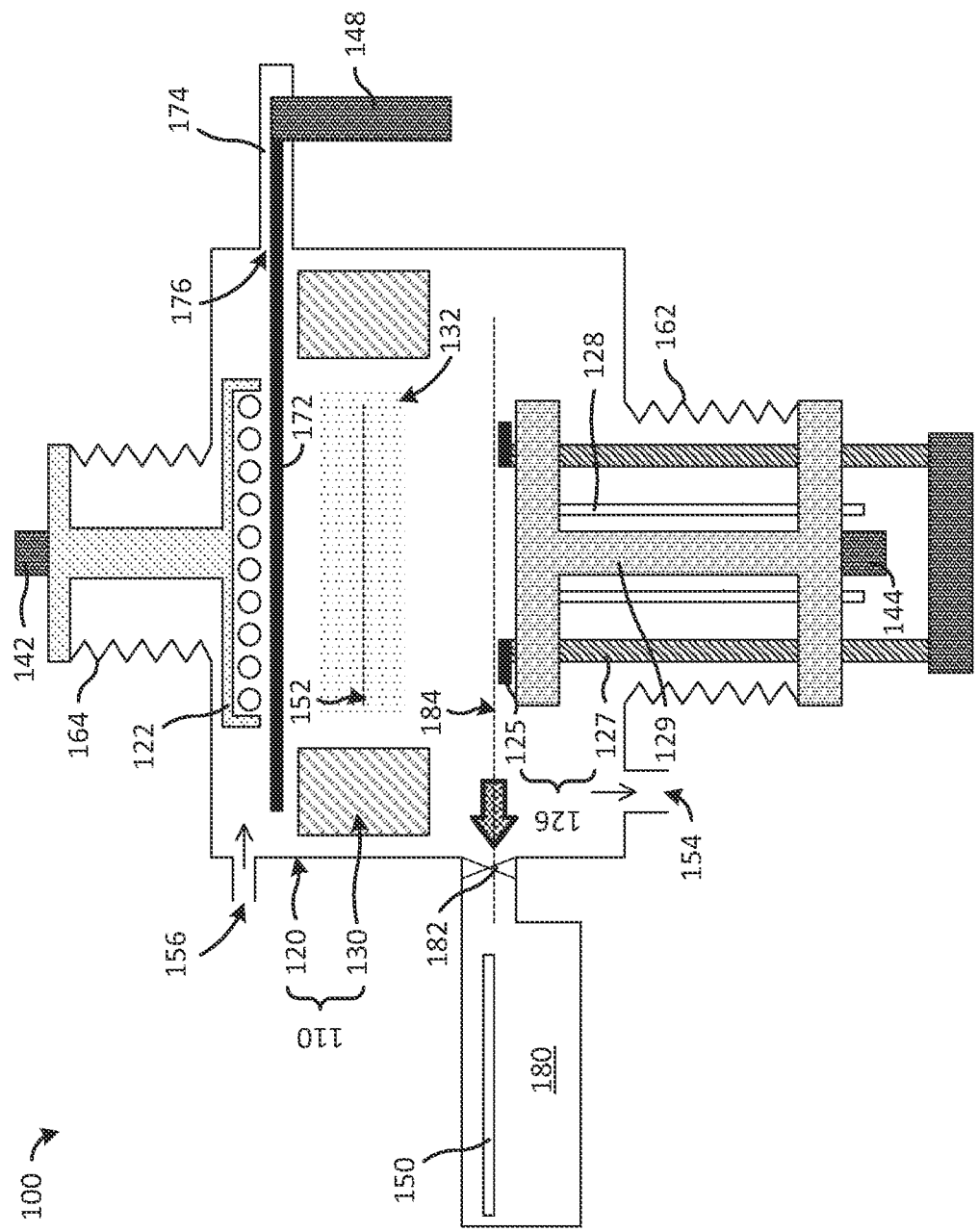

Operating the anneal chamber 120 in the substrate transfer mode to unload the substrate 150 out of the anneal chamber 120 is illustrated by the cross-sectional view of the system 100 in FIG. 4H. In this example embodiment, the substrate holder 125 received the substrate 150 from the cooler 124 at the transfer window location 184. Hence, the substrate lifter 126 need not be moved in order to position the substrate holder 125 of the substrate lifter 126 at the transfer window location. In some other embodiment, the substrate holder 125 of the substrate lifter 126 is first positioned at the transfer window location, as illustrated in FIG. 4G.

In FIG. 4H, with instructions from the controller 190, the load lock chamber 180 opens the gate valve 182, inserts the robotic arm (not shown), and positions the robotic arm to receive the substrate 150 at the transfer window location 184. With the robotic arm positioned to receive the substrate iso, the substrate 150 is released from the substrate holder 125, for example, by moving the substrate lifter 126 slightly away from the substrate 150 toward the cooler parking location, as illustrated in FIG. 4H. The substrate 150 may then be moved to the load lock chamber 180 by retracting the robotic arm from the anneal chamber 120 through the transfer window and the open the gate valve 182. Once the substrate is unloaded, the gate valve 182 may be closed.

In some applications, it is desirable to perform an in situ magnetic anneal of a deposited layer. For an in situ magnetic anneal, the substrate with the deposited layer is maintained in vacuum in the duration between completion of the deposition process and the completion of the magnetic annealing process. In other words, after a performing a deposition process to form the deposited layer, the substrate with the deposited layer is not exposed to an atmospheric ambient till after the magnetic annealing process is completed. Accordingly, in a system for processing a substrate through an in situ magnetic annealing process, the anneal chamber may be attached to a deposition system.

Example 1. Equipment for magnetic annealing of a substrate, the equipment including: an anneal chamber configured to heat and cool a substrate held at a soak location along a first direction in the anneal chamber, the anneal chamber including: a heater, a cooler, and a substrate lifter including a substrate holder, where the substrate holder is configured to support a substrate oriented such that the first direction is perpendicular to a major surface of the substrate; and a magnet assembly configured to establish a homogeneous zone in the anneal chamber, the soak location being within the homogeneous zone, the homogeneous zone including a region of magnetic field.

Example 2. The equipment of example 1, where the heater, the cooler, and the substrate lifter are configured to be movable in the first direction.

Example 3. The equipment of one of examples 1 to 2, where the anneal chamber is a vacuum chamber.

Example 4. The equipment of one of examples 1 to 3, where the heater and the cooler are configured to be swing into position.

Example 5. The equipment of one of examples 1 to 4, where the substrate lifter and the magnet assembly are configured to be move synchronously relative to the heater and the cooler.

Example 6. The equipment of one of examples 1 to 5, where the heater includes a ceramic heater or a plasma torch, where the plasma torch is coupled to a plasma source of energetic, charge neutral, chemically inert particles.

Example 7. The equipment of one of examples 1 to 6, where the cooler includes a cooling chuck configured to remove heat from a substrate placed on the cooling chuck, where the cooling chuck is coupled to a cooling mechanism including a flow of refrigerant.

Example 8. The equipment of one of examples 1 to 7, where the cooler includes a major surface that reflects infrared radiation, the major surface oriented in a direction facing the soak location.

Example 9. The equipment of one of examples 1 to 8, where the magnet assembly is disposed within the anneal chamber.

Example 10. The equipment of one of examples 1 to 9, where the magnet assembly is a Halbach cylinder having a central axis along the first direction, the Halbach cylinder being segmented in a plurality of sectors, where each sector includes a magnetic segment, where adjacent magnetic segments are magnetized in different directions, and where an arrangement of the magnetic segments forms a magnetization pattern that establishes the homogeneous zone within the central bore of the Halbach cylinder.

Example 11. The equipment of one of examples 1 to 10, where the equipment is configured to operate in a substrate transfer mode, a heating mode, and a cooling mode, where the substrate lifter is configured to move the substrate between the soak location and a substrate transfer window location, and where, in the substrate transfer mode, the substrate lifter is moving the substrate to load or unload the substrate at the substrate transfer location, the cooler is located at a cooler parking location further away from the soak location than the transfer window location, and the heater is located at a heater standby location away from the soak location and on the opposite side of the soak location as the cooler parking location.

Example 12. The equipment of one of examples 1 to 11, where the heater is configured to be operated at the heater standby location and an active heating location closer to the soak location than the heater standby location, where, during the heating mode, the heater is located at the active heating location, and where, during the cooling mode, the heater is located at the heater standby location.

Example 13. The equipment of one of examples 1 to 12, where the cooler is configured to be operated at the cooler parking location, a cooler standby location closer to the soak location than the cooler parking location, and an active cooling location, where, at the active cooling location a major surface of the cooler is at the soak location, where, during the cooling mode, the cooler is located at the active cooling location, and where, during the heating mode, the cooler is located at a cooler standby location.

Example 14. The equipment of one of examples 1 to 13, where the homogeneous zone extends over a region in the anneal chamber, the region being such that a substrate positioned at the soak location is immersed inside the homogeneous zone, where the heater and cooler are disposed on opposite sides of the soak location, and where the substrate holder is configured to support a substrate by contacting a portion of the substrate near the substrate edge and exposing the remaining portion of the substrate.

Example 15. The equipment of one of examples 1 to 14, where the substrate holder is configured to support a substrate by contacting a portion of a backside of the substrate near the substrate edge and exposing the remaining portion of the substrate.

Example 16. The equipment of one of examples 1 to 15, where the anneal chamber is configured to operate in a heating configuration, where, in the heating configuration, the substrate holder is supporting the substrate at the soak location, the heater is transferring heat to the substrate and, the cooler, positioned at a cooler standby location away from the soak location, is thermally decoupled from the substrate.

Example 17. The equipment of one of examples 1 to 16, where the anneal chamber is configured to operate in a cooling configuration, where, in the cooling configuration, the substrate is supported at the soak location with a major surface of the cooler in physical contact with a backside of the substrate, the cooler is removing heat from the substrate and, the heater, positioned at a heater standby location by moving the heater away from the substrate, is thermally decoupled from the substrate.

Example 18. The equipment of one of examples 1 to 17, where the anneal chamber is configured to operate in a substrate transfer configuration, where, in the substrate transfer configuration, the substrate lifter is moving the substrate between the soak location and a substrate transfer window location to load or unload the substrate, the heater is located at a heater standby location away from the soak location and, the cooler is positioned at a cooler parking location by moving the cooler away from the soak location, the cooler parking location being further from the soak location than the transfer window location.

Example 19. The equipment of one of examples 1 to 18, further including a baffle chamber including: a baffle window coupled to the anneal chamber; and a heat baffle configured to be inserted in the anneal chamber between the soak location and a heater standby location and retracted from the anneal chamber through the baffle window.

Example 20. A method including: operating an anneal chamber in a substrate transfer mode to load the substrate from a transfer window location to a soak location in the anneal chamber, the anneal chamber includes a heater, a cooler, a substrate lifter including a substrate holder, and a homogeneous zone established in the anneal chamber by a magnet assembly, the homogeneous zone including a region of magnetic field, the soak location being within the homogeneous zone; operating the anneal chamber in a heating mode to heat the substrate at the soak location; operating the anneal chamber in a cooling mode to cool the substrate at the soak location; and operating the anneal chamber in the substrate transfer mode to unload the substrate from the anneal chamber via the transfer window location.

Example 21. The method of example 20, where operating the anneal chamber in the substrate transfer mode to load the substrate includes: moving the substrate to the soak location by moving the substrate lifter, the substrate being supported by the substrate holder; and relatively moving the cooler toward the substrate to a cooler standby location.

Example 22. The method of one of examples 20 or 21, where operating the anneal chamber in the heating mode includes: relatively moving the heater to an active heating location proximate the substrate located at the soak location; and powering the heater to heat the substrate.

Example 23. The method of one of examples 20 to 22, where operating the anneal chamber in the heating mode further includes: prior to moving the heater to the active heating location, retracting a heat baffle located between the heater and the substrate; and after powering the heater, relatively moving the heater away from the substrate to a heater standby location and inserting the heat baffle between the heater and the substrate.

Example 24. The method of one of examples 20 to 23, where operating the anneal chamber in the cooling mode includes: relatively moving the cooler from a cooler standby location to an active cooling location proximate the substrate located at the soak location; and powering the cooler to cool the substrate.

Example 25. The method of one of examples 20 to 24, where operating the anneal chamber in the substrate transfer mode to unload the substrate includes: releasing the substrate from the substrate holder by moving the substrate lifter away from the substrate towards a cooler parking location; and moving the substrate to a load lock chamber by retracting a robotic arm from the anneal chamber through a gate valve and closing the gate valve.

Example 26. The method of one of examples 20 to 25, where operating the anneal chamber in the substrate transfer mode to load the substrate includes: configuring the anneal chamber in an initial configuration, the initial configuration including: the cooler being positioned at a cooler parking location, the transfer window location being between the cooler parking location and the soak location, the substrate holder of the substrate lifter being positioned at the transfer window location, and the heater being positioned at a heater standby location located at a distance from the soak location on the opposite side of the soak location as the cooler;

receiving the substrate by lifting the substrate with the substrate lifter off a robotic arm supporting the substrate at the transfer window location, the robotic arm extending through a gate valve coupling the anneal chamber to a load lock chamber; retracting the robotic arm from the anneal chamber through the gate valve and closing the gate valve; moving the substrate to the soak location by moving the substrate lifter, the substrate being supported by the substrate holder; and moving the cooler toward the substrate to a cooler standby location located at a sufficient distance from the soak location to prevent the cooler from cooling the substrate.

Example 27. The method of one of examples 20 to 26, where operating the anneal chamber in the heating mode includes: moving the heater from the heater standby location to an active heating location proximate the substrate located at the soak location; powering the heater to an active power level to heat the substrate at a selected high soak temperature for a selected soak duration; after the soak duration, reducing the power provided to the heater to a standby power level; and moving the heater away from the substrate to the heater standby location.

Example 28. The method of one of examples 20 to 27, where operating the anneal chamber in the heating mode further includes: prior to moving the heater from the heater standby location to the active heating location, retracting a heat baffle located between the heater and the substrate; and after moving the heater away from the substrate to the heater standby location, inserting a heat baffle between the heater and the substrate.

Example 29. The method of one of examples 20 to 28, where operating the anneal chamber in the cooling mode includes: moving the cooler from the cooler standby location to an active cooling location proximate the substrate located at the soak location; sustaining power to a cooling mechanism of the cooler to cool the substrate until the substrate is cooled below a selected low temperature, the selected low temperature being greater than room temperature and less than the selected high soak temperature; and after the substrate is cooled below the selected low temperature, moving the cooler to the cooler parking location, the substrate remaining at the soak location supported by the substrate holder.

Example 30. The method of one of examples 20 to 29, where operating the anneal chamber in the substrate transfer mode to unload the substrate includes: positioning the substrate holder of the substrate lifter at the transfer window location; opening the gate valve, inserting the robotic arm, and positioning the robotic arm to receive the substrate at the transfer window location; releasing the substrate from the substrate holder by moving the substrate lifter away from the substrate toward the cooler parking location; and moving the substrate to the load lock chamber by retracting the robotic arm from the anneal chamber through the gate valve and closing the gate valve.

Example 31. A system for processing a substrate, the system including: an anneal chamber configured to operate in a substrate transfer mode, heating mode, and a cooling mode, the anneal chamber including a heater, a cooler, and a substrate lifter; a magnet assembly establishing a homogeneous zone in the anneal chamber, the homogeneous zone being a region of magnetic field; a vertical drive system coupled to the anneal chamber and configured to move the heater, the cooler, and the substrate lifter between the substrate transfer, heating, and cooling modes; a load lock chamber and a gate valve coupling the load lock chamber to the anneal chamber, the load lock chamber including a robotic arm configured to transfer the substrate between the load lock chamber and the substrate lifter through the gate valve; and a controller programmed to synchronize the operation of the vertical drive system, and the load lock chamber.

Example 32. The system of example 31, further including: a baffle chamber including a heat baffle; and a baffle window coupling the baffle chamber to the anneal chamber, the heat baffle being configured to move from a location in the anneal chamber between the heater and the substrate lifter to the baffle chamber, the controller programmed to synchronize the operation of the baffle chamber.

Example 33. The system of one of examples 31 or 32, where the heat baffle includes a cooling jacket, and where the cooling jacket is coupled to a cooling mechanism including a flow of refrigerant.

Example 34. The system of one of examples 31 to 33, where the anneal chamber is attached to a deposition system.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. Equipment for magnetic annealing of a substrate, the equipment comprising:
an anneal chamber configured to heat and cool the substrate held at a soak location along a first direction in the anneal chamber, the anneal chamber comprising:
a heater configured to move along the first direction relative to the substrate held at the soak location,
a cooler configured to move along the first direction relative to the substrate held at the soak location, and
a substrate lifter comprising a substrate holder, wherein the substrate holder is configured to support the substrate oriented such that the first direction is perpendicular to a major surface of the substrate; and
a magnet assembly configured to establish a homogeneous zone in the anneal chamber, the soak location being within the homogeneous zone, the homogeneous zone comprising a region of magnetic field.

2. The equipment of claim 1,
wherein the substrate lifter is configured to be movable in the first direction.

3. The equipment of claim 1, wherein the anneal chamber is a vacuum chamber.

4. The equipment of claim 1, wherein the heater and the cooler are configured to swing into position.

5. The equipment of claim 1, wherein the substrate lifter and the magnet assembly are configured to be moved synchronously relative to the heater and the cooler.

6. The equipment of claim 1, wherein the heater comprises a ceramic heater or a plasma torch, wherein the plasma torch is coupled to a plasma source of energetic, charge neutral, chemically inert particles.

7. The equipment of claim 1,
wherein the homogeneous zone extends over a region in the anneal chamber, the region being such that the substrate positioned at the soak location is immersed inside the homogeneous zone,
wherein the heater and cooler are disposed on opposite sides of the soak location, and wherein the substrate holder is configured to support the substrate by contacting a portion of the substrate near a substrate edge and exposing the remaining portion of the substrate.

8. The equipment of claim 7 further comprising a baffle chamber comprising:
a baffle window coupled to the anneal chamber; and
a heat baffle configured to be inserted in the anneal chamber between the soak location and a heater standby location and retracted from the anneal chamber through the baffle window.

9. A method comprising:
operating an anneal chamber in a substrate transfer mode to load a substrate from a transfer window location to a soak location in the anneal chamber, the anneal chamber comprises a heater, a cooler, a substrate lifter comprising a substrate holder, and a homogeneous zone established in the anneal chamber by a magnet assembly, the homogeneous zone comprising a region of magnetic field, the soak location being within the homogeneous zone;
operating the anneal chamber in a heating mode to heat the substrate at the soak location, wherein operating the anneal chamber in the heating mode comprises:
relatively moving the heater to an active heating location proximate the substrate located at the soak location; and
powering the heater to heat the substrate;
operating the anneal chamber in a cooling mode to cool the substrate at the soak location; and
operating the anneal chamber in the substrate transfer mode to unload the substrate from the anneal chamber via the transfer window location.

10. The method of claim 9, wherein operating the anneal chamber in the substrate transfer mode to load the substrate comprises:
moving the substrate to the soak location by moving the substrate lifter, the substrate being supported by the substrate holder; and
relatively moving the cooler toward the substrate to a cooler standby location.

11. The method of claim 9, wherein operating the anneal chamber in the heating mode further comprises:
prior to moving the heater to the active heating location, retracting a heat baffle located between the heater and the substrate; and
after powering the heater, relatively moving the heater away from the substrate to a heater standby location and inserting the heat baffle between the heater and the substrate.

12. The method of claim 9, wherein operating the anneal chamber in the cooling mode comprises:
relatively moving the cooler from a cooler standby location to an active cooling location proximate the substrate located at the soak location; and
powering the cooler to cool the substrate.

13. The method of claim 9, wherein operating the anneal chamber in the substrate transfer mode to unload the substrate comprises:
releasing the substrate from the substrate holder by moving the substrate lifter away from the substrate towards a cooler parking location; and
moving the substrate to a load lock chamber by retracting a robotic arm from the anneal chamber through a gate valve and closing the gate valve.

14. A system for processing a substrate, the system comprising:
an anneal chamber comprising a heater, a cooler, and a substrate lifter;
a magnet assembly establishing a homogeneous zone in the anneal chamber, the homogeneous zone being a region of magnetic field;
a vertical drive system coupled to the anneal chamber and configured to independently move the heater, the cooler, and the substrate lifter relative to the homogeneous zone; and
a controller programmed to synchronize an operation of the vertical drive system.

15. The system of claim 14, further comprising:
a baffle chamber comprising a heat baffle; and
a baffle window coupling the baffle chamber to the anneal chamber, the heat baffle being configured to move from a location in the anneal chamber between the heater and the substrate lifter to the baffle chamber, the controller programmed to synchronize the operation of the baffle chamber.

16. The system of claim 15, wherein the heat baffle comprises a cooling jacket, and wherein the cooling jacket is coupled to a cooling mechanism comprising a flow of refrigerant.

17. The system of claim 14, wherein the anneal chamber is attached to a deposition system.

18. The system of claim 14, wherein the magnetic field comprises a unidirectional and/or uniform magnetic field.

19. The system of claim 14, wherein the magnetic assembly comprises an array of magnets disposed around a central axis of the anneal chamber.

20. The system of claim 14, wherein the heater is disposed within the anneal chamber.

* * * * *